(12) United States Patent
Viehmann et al.

(10) Patent No.: US 6,853,229 B2
(45) Date of Patent: Feb. 8, 2005

(54) CIRCUIT FOR TRANSFORMING A SINGLE ENDED SIGNAL INTO A DIFFERENTIAL MODE SIGNAL

(75) Inventors: Hans-Heinrich Viehmann, S. Burlington, VT (US); Stefan Lammers, South Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/391,850

(22) Filed: Mar. 19, 2003

(65) Prior Publication Data

US 2004/0183580 A1 Sep. 23, 2004

(51) Int. Cl.[7] .............................................. H03K 3/356
(52) U.S. Cl. ........................ 327/212; 327/52; 327/218; 327/199
(58) Field of Search ........................ 327/52, 202, 212, 327/218, 199; 330/252–253

(56) References Cited

U.S. PATENT DOCUMENTS

| 4,881,044 A | * | 11/1989 | Kinoshita et al. ........... 330/253 |
| 5,920,218 A | * | 7/1999 | Klass et al. ................. 327/200 |
| 5,966,005 A | * | 10/1999 | Fujimori ..................... 323/315 |
| 6,492,855 B1 | * | 12/2002 | Pasqualini ................... 327/211 |

* cited by examiner

Primary Examiner—Quan Tra
(74) Attorney, Agent, or Firm—Slater & Matsil, L.L.P.

(57) ABSTRACT

An apparatus for transforming single ended signals into differential mode signals. A preferred embodiment comprises an inverter (for example, inverter 505) and a pair of latches (for example, latches 510 and 520). One latch has as its input an input signal to be converted and the other latch has as its input an inverse of the input signal. The latches maybe clocked by a differential mode clock and remove a timing mismatch between the input signal and its inverse that is incurred via the inverter. The latch outputs are then provided to a differential mode buffer to perform signal voltage and current compatibility transformations.

17 Claims, 6 Drawing Sheets

US 6,853,229 B2

CIRCUIT FOR TRANSFORMING A SINGLE ENDED SIGNAL INTO A DIFFERENTIAL MODE SIGNAL

TECHNICAL FIELD

The present invention relates generally to logic circuits, and more particularly to an apparatus for transforming single ended signals into differential mode signals.

BACKGROUND

When high-speed and low voltage swing data transfer is needed, differential signaling (also commonly referred to as double ended signals), wherein signals are carried on two conductors and the signal is defined as the difference in the two signals. Differential signaling is perhaps the most robust and promising signaling concept. Current mode logic (CML), a design technique commonly used in high speed signaling applications such as communications chips and routers, uses differential signaling.

CML is widely used in high-speed applications due to its relatively low power consumption and low supply voltage when compared to other types of logic, such as emitter coupled logic (ECL). CML is also considerably faster than CMOS logic due to its lower voltage swings. CML also has an added advantage of the capability of being fabricated using CMOS fabrication technology.

One advantage that CMOS logic has over CML is that in a CML circuit, there can be current flow a standby state, while in CMOS logic, no current flows in the standby state. Therefore, CML circuits will typically use more power than CMOS logic circuits.

However, since CML circuits and CMOS logic circuits may be created on the same substrate, it is possible to combine CML and CMOS logic circuits into one design. Thus, the high-speed advantages of CML circuits may be exploited where there is a need for high-speed switching, while CMOS logic's low power consumption is available when the utmost high-speed is not required.

Unfortunately, CML circuits use differential signaling while CMOS logic circuits use single ended signals, wherein signals are carried on a single conductor. Therefore, a conversion between a CMOS logic circuit's single ended signals to a CML circuit's differential signals is needed.

A commonly used solution uses a single ended mode to differential mode converter to perform the conversion from single ended signals into differential mode signals. The solution uses a simple inverter to provide a signal and its inverse.

A disadvantage of the prior art is that the simple inverter places a gate delay into the inverse of the input signal that is not present in the input signal itself. The timing mismatched signals may result in a situation wherein both portions of a CML circuit being turned on or turned off. This leads to a poor CML slope which can have detrimental effects on the performance (such as maximum operating frequency) of the circuitry.

SUMMARY OF THE INVENTION

These and other problems are generally solved or circumvented, and technical advantages are generally achieved, by preferred embodiments of the present invention which presents an apparatus for converting single ended signals into differential mode signals.

In accordance with a preferred embodiment of the present invention, a circuit comprising a first clocked latch having an input coupled to an input signal, the first clocked latch to capture a value at its input when triggered by a first clock signal, an inverter having an input coupled to the input signal, the inverter to invert the input signal, a second clocked latch having an input coupled to an output of the inverter, the second clocked latch to capture a value at its input when triggered by a second clock signal, and a differential mode circuit having a first input coupled to an output of the first clocked latch and a second input coupled to an output of the second clocked latch, the differential mode circuit containing circuitry to convert signals at its inputs into a differential mode signal.

In accordance with another preferred embodiment of the present invention, a circuit comprising a first clocked latch having an input coupled to a signal input, the first clocked latch for use in storing a value at its input when triggered by a first clock, an inverter having an input coupled to the signal input, the inverter to produce an inverted version of a signal at its input, a second clocked latch having a input coupled to the inverter, the second clocked latch for use in storing a value at its input when triggered by a second clock, and a differential mode circuit having a first input coupled to an output of the first clocked latch and a second input coupled to an output of the second clocked latch, the differential mode circuit for use in converting signal values at the first and second inputs to a differential mode signal.

An advantage of a preferred embodiment of the present invention is that there is essentially no timing mismatch between the input signal and its inverted version. Therefore, the operating frequency of circuitry attached to the converter may be increased.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a CMOS logic signal to current mode logic signal converter. The invention may also be applied, however, to other situations wherein a single ended signal is to be converted into a differential mode signal.

Figure 1:
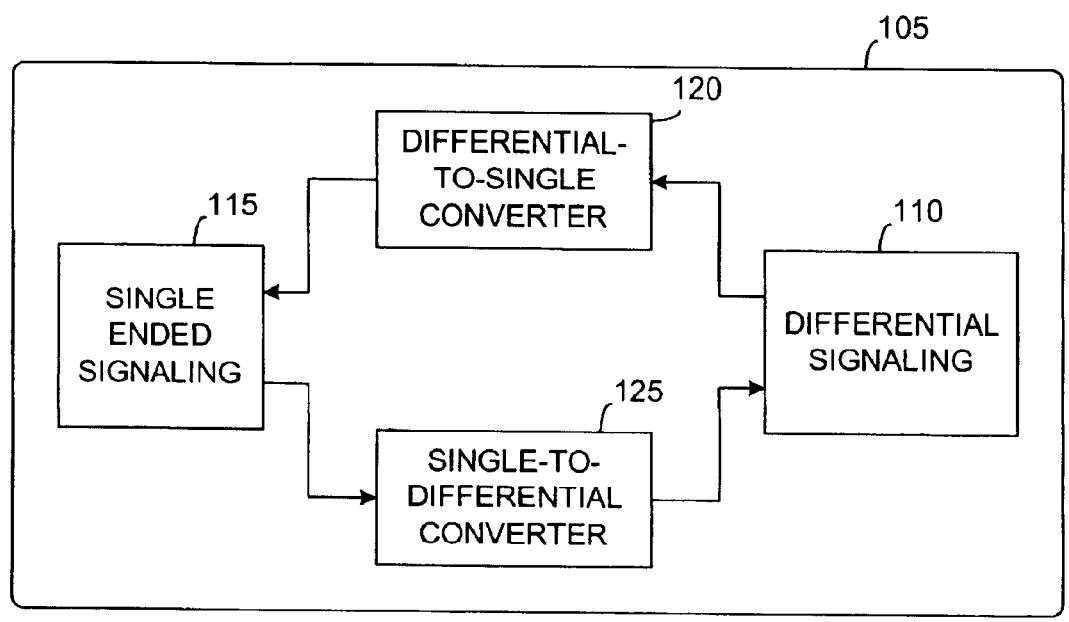
FIG. 1 is a diagram of a logic circuit containing sub-circuits using both differential mode and single ended mode signaling and signal converters.

With reference now to FIG. 1, there is shown a diagram illustrating a logic circuit 105 that has sub-circuits 110 and 115 that uses differential mode signaling and single ended mode signaling respectively. The sub-circuits 110 and 115 also communicate to one another. Unfortunately, the signaling modes used by the sub-circuits are incompatible and a converter is needed to perform a translation. A differential-to-single converter 120 is needed to allow signals from sub-circuit 110 to be understood by sub-circuit 115 and a single-to-differential converter 125 is needed for signals from sub-circuit 115 going to sub-circuit 110. If the communications is always one way (for example, from the sub-circuit 115 to the sub-circuit 110), then only one of the two converters (the single-to-differential converter 120) is needed.

As illustrated in FIG. 1, the sub-circuits 110 and 115 may be a part of the logic circuit 105 and these particular sub-circuits are the only ones that need to exchange signals. If this is the case, then there may be other sub-circuits that are coupled to the sub-circuits 110 and 115 but are not shown in the figure. Alternatively, the sub-circuits 110 and 115 may be the only circuits (other than the converters 120 and 125) in the logic circuit 105.

Figure 2:
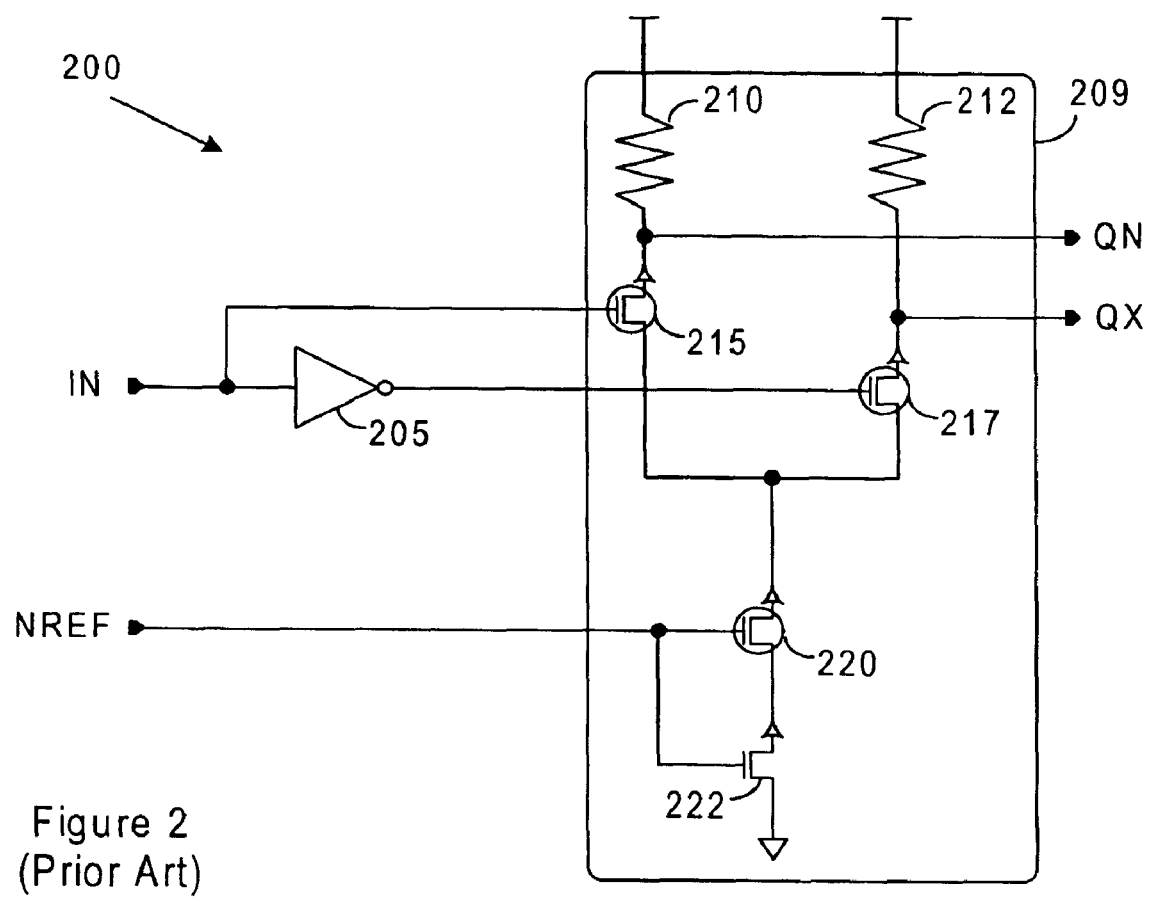
FIG. 2 is a diagram of a prior art single ended mode to differential mode signal converter.

With reference now to FIG. 2, there is shown a diagram illustrating a schematic view of a prior art single ended signal to differential mode signal converter (SEDMC) 200. The SEDMC 200 is used to convert a single ended signal (for example, the signals used in complementary metal oxide semiconductor (CMOS) logic circuits) into a differential mode signal (for example, the signals used in current mode logic (CML) circuits). As discussed above, a single ended signal may be converted into a differential mode signal by creating a first and a second signal representation of the single ended signal, wherein the first and the second signals are complements of one another.

An inverter 205 is used to create an inverse of an input signal "IN". The inverse of the input signal is sometimes referred to as "IN'", "IN̄", "IN complement", "IN bar", and so forth. The input signal "IN" and its inverse "IN'," may then be thought of as the two component signals of a differential signal. After inversion, the input signal "IN" and its inverse "IN'" are provided to a CML circuit 209. The CML circuit 209 is used to convert the voltage and current levels and polarity of the input signal (and its inverse) into voltage and current levels that are compatible with CML circuitry. The CML circuit 209 produces a differential mode output signal "Q" with component signals "QN" and "QX".

The CML circuit 209 is a CML buffer and is made from a pair of resistors 210 and 212, each with a terminal coupled to a voltage supply and with an N-channel MOSFET (metal oxide semiconductor field-effect transistor), such as transistor 215, coupled at the other terminal. The input signal and its inverse are coupled to the N-channel MOSFETs at their gate terminals. An additional pair of N-channel MOSFETs 220 and 222 create a reference current source.

When a transistor (such as transistor 215) is turned on by its input (such as input signal "IN"), a current path is created through resistor 210 and transistors 215, 220, and 222. With the current flow, a voltage drop is realized across the resistor 210. Therefore, the output (taken at a node between the resistor 210 and the transistor 215) is at a voltage potential that is smaller in magnitude than at the voltage supply. When there is no current flow, the output is at the same voltage potential as the voltage supply. The two voltage potentials are used to represent the high and the low logic states.

The use of the inverter 205 to create the component signals of a differential mode signal from a single ended input signal introduces a propagation delay into the one of the component signals (the inverted input signal "IN'") that is not present in the component signal. This timing mismatch between the component signals can result in the CML circuit 209 operating with both of its two transistors which are coupled to the input signals (transistors 215 and 217) to be on (or off) at the same time.

Figure 3:
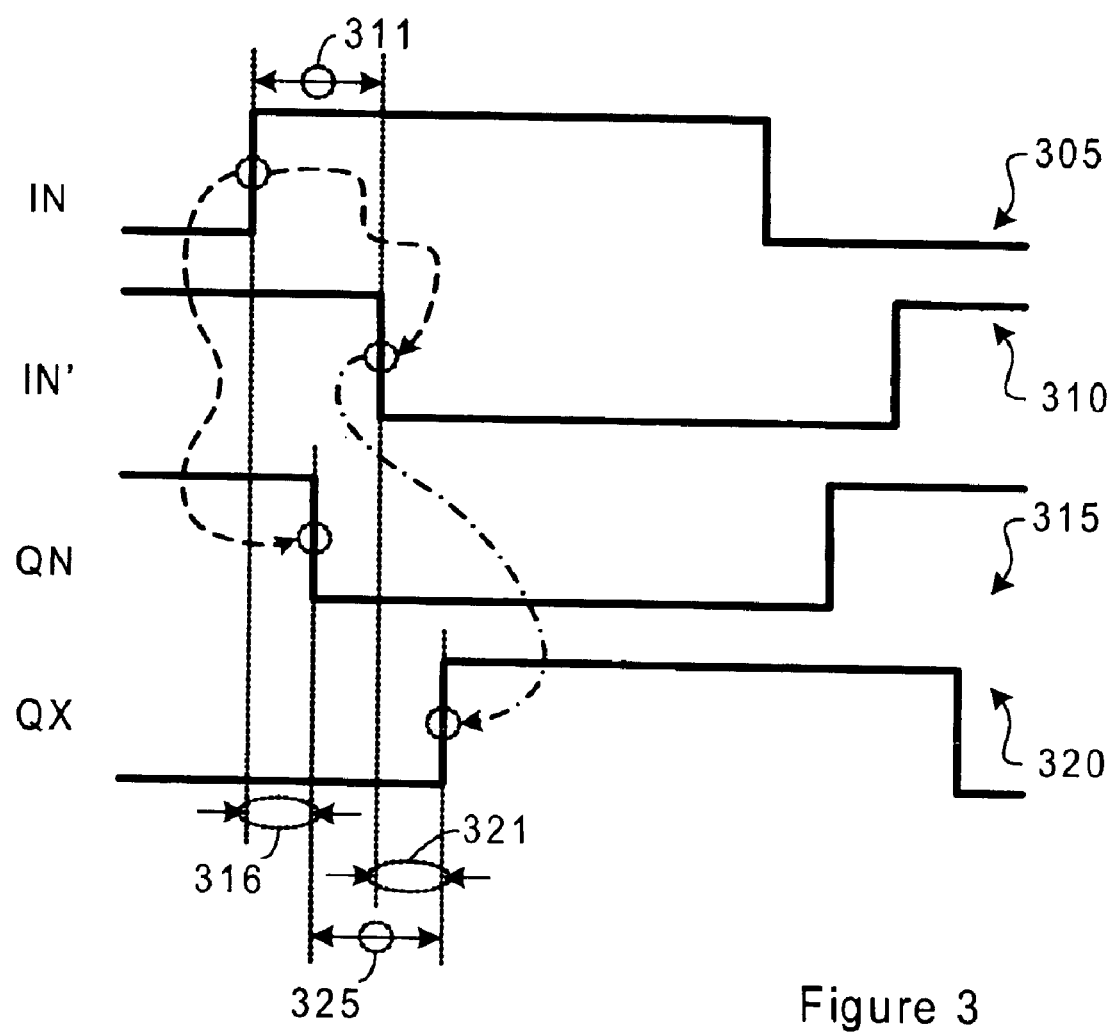
FIG. 3 is a timing diagram of a timing mismatch incurred by the use of an inverter in the prior art single ended mode to differential mode signal converter.

With reference now to FIG. 3, there is shown a timing diagram illustrating the effect of the timing mismatch in the differential input signals resulting from the use of an inverter. A first curve 305 in the timing diagram illustrates a portion of an input signal "IN" and a second curve 310 illustrates a portion of an inverse of the input signal "IN'". As described in FIG. 2, the inverse of the input signal is generated by passing the input signal through an inverter. Note that the use of an inverter to generate the inverse input signal "IN'" introduces a propagation delay into the inverse input signal "IN'". The propagation delay introduces a timing mismatch between the input signal "IN" and its inverse "IN'", with the timing mismatch highlighted in FIG. 3 via highlight 311.

The input signal "IN" and its inverse "IN'" are then provided to the inputs of the CML buffer 209 (FIG. 2) which provides signal voltage and current compatibility conversion and produces an output differential signal. Since the input signal and its inverse passes through an equivalent number of circuit elements in the CML buffer 209, each is delayed by an equivalent amount. A third curve 315 and a fourth curve 320 illustrate outputs of the CML buffer 209. The third curve 315 corresponds to the input signal "IN" while the fourth curve 320 corresponds to the inverse of the input signal "IN'". Highlights 316 and 321 highlights the propagation delay through the CML buffer 209 encountered by the input signal and its inverse.

Due to the propagation delay incurred by going through the inverter and the resulting timing mismatch, the component signals of differential mode output of the CML buffer 209, for a period of time that is approximately equal to the propagation delay of the inverter, have the same value. This period of time is indicated in FIG. 3 with highlight 325. This is an undesired situation since the component signals of a differential signal should not have the same value. This may lead to a poor CML slope that has an effect on the operating speed of the circuitry and the timing mismatch should be eliminated or minimized.

Figure 4:
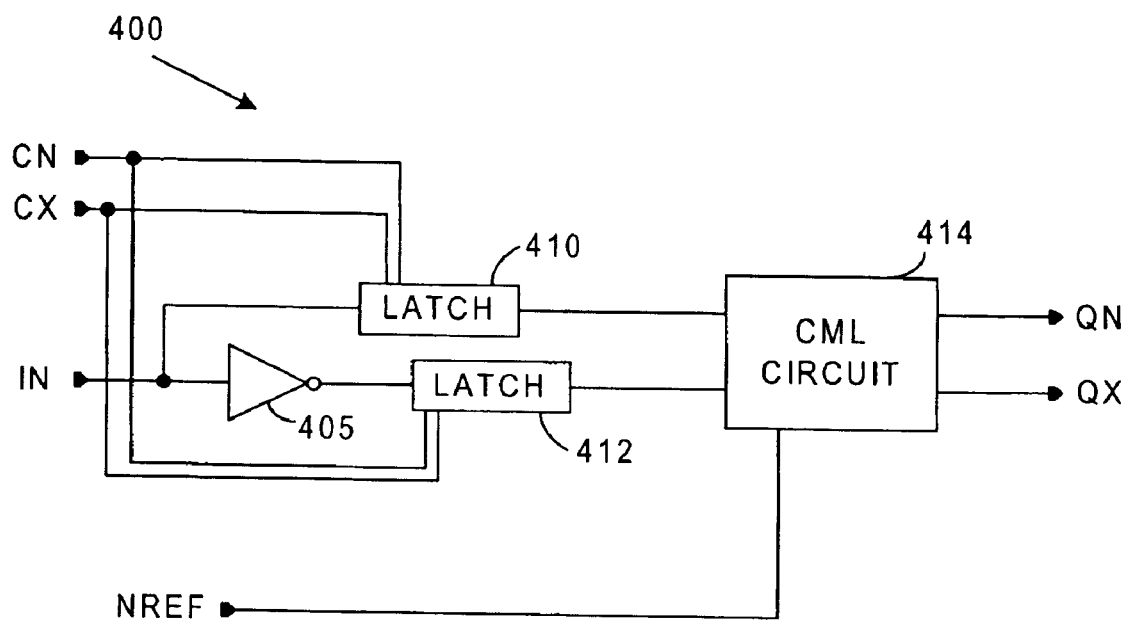
FIG. 4 is a diagram of a high-level view of a single ended mode to differential mode signal converter, according to a preferred embodiment of the present invention.

With reference now to FIG. 4, there is shown a diagram illustrating a high-level view of a single ended mode signal to differential mode signal (SEDMC) 400 wherein a timing mismatch between an input signal and its inverse has been eliminated, according to a preferred embodiment of the present invention. To produce an inverse of the input signal, the SEDMC 400 uses an inverter 405, like in the SEDMC 200 (FIG. 2). The use of the inverter 405 may introduce a propagation delay, and hence a timing mismatch may be introduced between the input signal and its inverse, like in the SEDMC 200.

A pair of latches 410 and 412, clocked by a differential clock "CN" and "CX," may be used to eliminate the timing mismatch. The first latch 410 may have as its input the input signal "IN" while the second latch 412 may have as its input the inverse of the input signal (the output of the inverter 405). According to a preferred embodiment of the present invention, the period of the differential clock may be of sufficient duration so that the latches will be able to latch onto the value of the input signal and its inverse after the inverse propagates through the inverter 405. This implies that the period of the differential clock should be greater than the propagation delay of the inverter 405. Additionally, the frequency of the differential clock should be greater than or equal to two times the rate in which the input signal changes, in order to ensure that the latches may accurately represent the input signal.

The output of the latches 410 and 412 (the component signals of the input signal) can then be provided to a CML circuit 414 that may be used to perform any signal voltage and current conversions to ensure that the differential signal is compatible with CML circuitry. According to a preferred embodiment of the present invention, the CML circuit 414 may be a CML buffer, similar to the CML buffer 209 discussed in FIG. 2.

Figure 5:
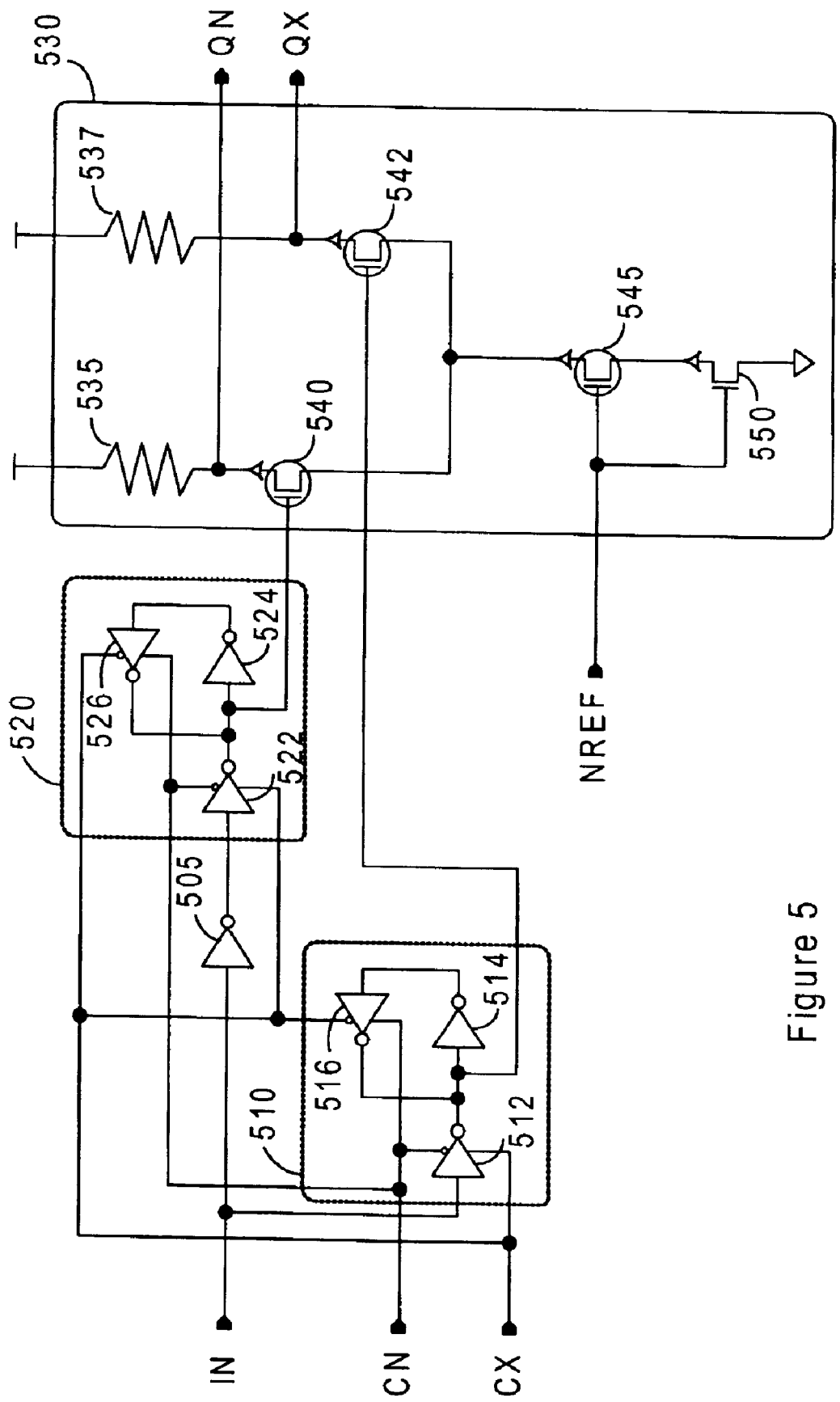
FIG. 5 is a diagram of a schematic view of a single ended mode to differential mode signal converter, according to a preferred embodiment of the present invention.

With reference now to FIG. 5, there is shown diagram illustrating a schematic of a SEDMC 500, according to a preferred embodiment of the present invention. The SEDMC 500 uses an inverter 505 to create an inverse of an input signal. As discussed earlier, the use of the inverter 505 inserts a propagation delay into the inverse signal and hence creates a timing mismatch between the input signal and its inverse. For optimum performance, there should be no (or very little) timing mismatch between the input signal and its inverse. This is because a timing mismatch may result in input transistors in a differential mode circuit that may be coupled to the input signal and its inverse having a similar state, an undesired event in differential mode circuits.

The SEDMC 500 features a pair of latches, a first latch 510 and a second latch 520, to help eliminate the timing mismatch. The latches 510 and 520 may be clocked by a differential clock "CN" and "CX". If the period of the differential clock is sufficiently large (greater than or equal to the propagation delay of the inverter 505), then the latches 510 and 520 may be able to eliminate the timing mismatch. According to a preferred embodiment of the present invention, the differential clock should have a frequency that is greater than or equal to twice the rate of change of the input signal.

The first latch 510 may have the input signal as its input while the second latch 520 may work with the inverse of the input signal. According to a preferred embodiment of the present invention, each latch may be created out of three inverting buffers. Taking a closer look at the first latch 510 (the description may also apply to the second latch 520), there are three inverting buffers 512, 514, and 516, with inverting buffers 512 and 516 being tri-state inverting buffers while inverting buffer 514 may be unclocked. The inverting buffer 514 and the tri-state inverting buffer 516 may be arranged in a circular fashion, wherein an input of inverting buffer 514 may be an output of the inverting buffer 516 and an input of inverting buffer 516 may be an output of the inverting buffer 514. Note that the circular arrangement of the inverting buffer 514 and the tri-state inverting buffer 516 may be used to create the memory storing capability of the latch itself. The tri-state inverting buffer 512 may have as its input the input signal and an output that may be coupled to the input of the inverting buffer 514. The output of the inverting buffer 512 may also be the output for the first latch 510. Note that as described, the latch 510 is an inverting latch, wherein its output maybe an inverse of its input. The second latch 520 has as its input, the output of the inverter 505 (the inverse of the input signal).

The latch 510 (and latch 520) may operate as follows: after a first transition of the differential clock, perhaps when clock "CX" is high and "CN" is low, the tri-state inverting buffer 512 becomes active and permits the input signal through and inverts the input signal at the same time. The inverted input signal (at the output of the tri-state inverting buffer 512) may also become the input to the inverting buffer 514 as well as the output of the latch 510. However, due to wiring differences between the tri-state inverting buffers 512 and 516, the tri-state inverting buffer 516 may be inactive. The tri-state inverting buffer 512 may be connected to the clocks "CN" and "CX" with a reversed polarity when compared to how the tri-state inverting buffer 516 is connected to the clocks. For example, if a tri-state inverting buffer has a first and a second clock input, then the tri-state inverting buffer 512 may have "CN" coupled to the first clock input and "CX" coupled to the second clock input. However, the tri-state inverting buffer 516 may be connected with a reversed polarity, such as "CX" coupled to the first clock input and "CN" coupled to the second clock input.

Then, a subsequent transition of the differential clock, when clock "CX" becomes low and "CN" becomes high, the tri-state inverting buffer 516 becomes active and the tri-state inverting buffer 512 becomes inactive. The value in the inverting buffer 514 may then be accepted by the now active tri-state inverting buffer 516. Since the tri-state inverting buffer 512 is now inactive, any changes to the input signal may not be accepted.

Note that both latches 510 and 520 may be connected to the same differential clock, hence both latches may react in a similar fashion to changes in the differential clock, meaning that the two latches 510 and 520 may be accepting (or rejecting) the input signal (and its inverse) at the same time.

According to a preferred embodiment of the present invention, at each period of the differential clock, the latches 510 and 520 capture the signal at their respective inputs and puts the input value at the output. The circularly connected inverting buffers (for example, inverting buffers 514 and 516) maintain the input value at the output until the next differential clock transition. Alternatively, the latches 510 and 520 may be designed to capture the input signals on a rising or falling edge of the differential clock, it may capture the input at a mid-point during a clock period, and so forth.

The outputs of the latches 510 and 520 may then be provided to a CML buffer 530. According to a preferred embodiment of the present invention, the CML buffer 530 may be constructed from several resistors and N-channel MOSFETs. Note that it is possible to create the CML buffer 530 out of P-channel MOSFETs with relatively minor adjustments to the CML buffer design as illustrated in FIG. 5. The CML buffer 530 may include a pair of resistor/ transistor combinations (for example, resistor 535 and transistor 540). The resistor and transistor in a combination may be connected serially, with a first terminal of the resistor coupled to a voltage supply while a second terminal of the resistor coupled to a drain terminal of the transistor. The transistor's gate terminal may be coupled to one of the two input signals provided by the latches 510 and 520, with the transistor in the other resistor/transistor combination being coupled to the remaining input signal provided by the latches 510 and 520. The sources of the two transistors may be coupled together and then to a reference current source.

The reference current source may be created from a pair of N-channel MOSFETs (for example, transistors 545 and 550). A drain of transistor 545 may be coupled to the sources of the transistors in the two resistor/transistor combinations while the source of transistor 545 may be coupled to a drain of transistor 550. Both gate terminals of the two transistors 545 and 550 may be coupled together and to a reference voltage level, NREF. According to a preferred embodiment of the present invention, the transistors 540 (and 542) and 545 may have low threshold voltage levels.

When one of the inputs to the CML buffer 530 assumes a low value, the transistor to which it is coupled may be turned on and a current path may be created. For example, if the transistor 540 is turned on, then a current path may be created that includes the resistor 535 and the transistors 540, 545, and 550. The current flow may result in a voltage drop across the resistor 535. This can result in an output voltage potential that is less than the voltage potential of the voltage supply to which the resistor 535 may be coupled.

When an input is high, the transistor to which it is coupled is turned off and a current path may not exist. When there is not a current path, current cannot flow and there may not be a corresponding voltage drop across a resistor (for example, resistor 535). Without a voltage drop across the resistor 535, then the output voltage potential may be equal to the voltage potential of the voltage supply to which the resistor may be coupled.

Figure 6:
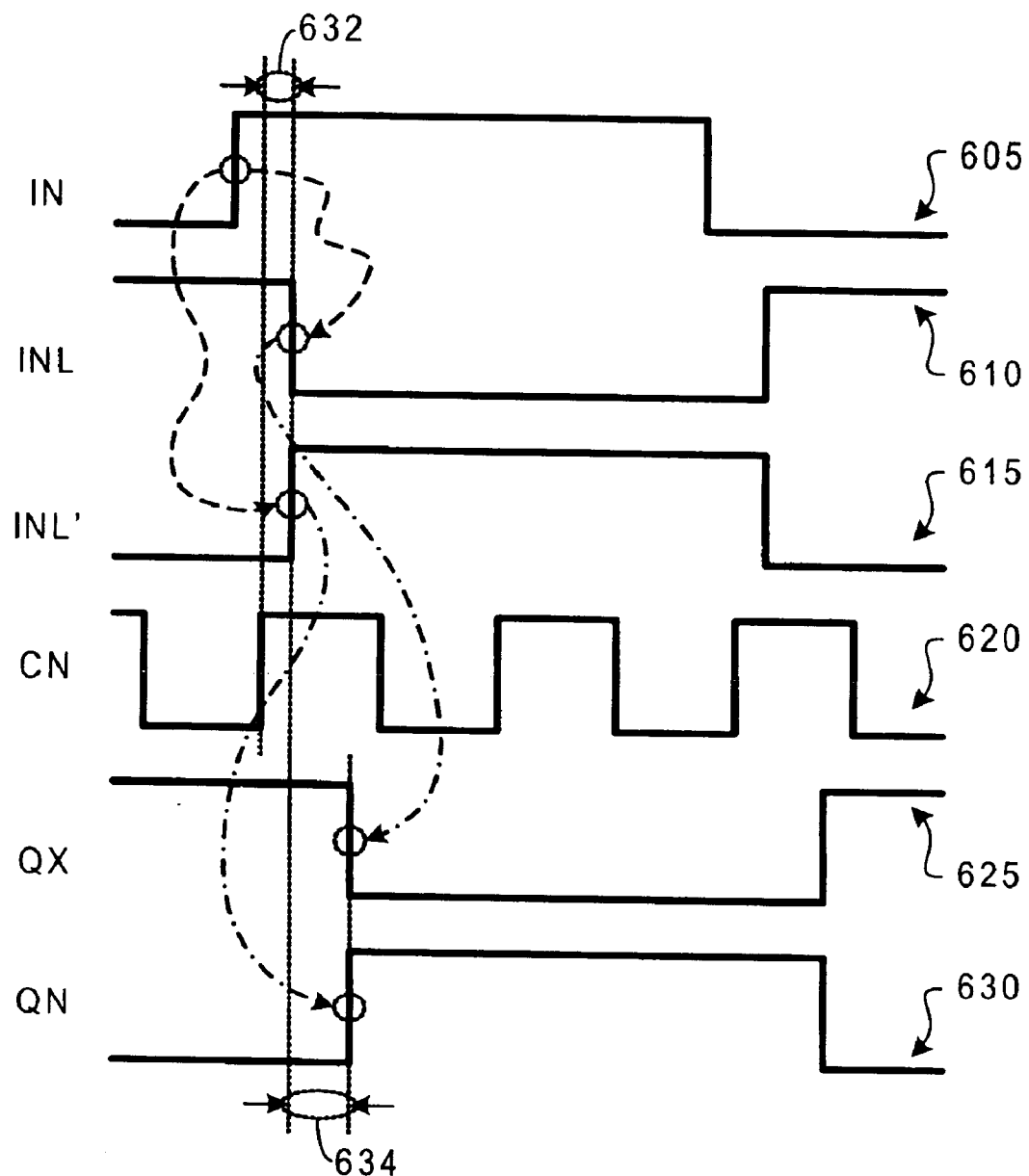
FIG. 6 is a timing diagram of the elimination of a timing mismatch incurred by the use of an inverter in a single ended mode to differential mode signal converter, according to a preferred embodiment of the present invention.

With reference now to FIG. 6, there is shown a timing diagram illustrating the effect of latches on the timing mismatch in the differential input signals resulting from the use of an inverter, according to a preferred embodiment of the present invention. A first curve 605 in the timing diagram illustrates a portion of the input signal "IN". A second and third curve 610 and 615 illustrates the outputs of the latches (such as latches 510 and 520 (FIG. 5)) while a fourth curve 620 illustrates one component signal of a differential clock used to clock the latches. A fifth and sixth curve 625 and 630 illustrate the differential outputs of a CML buffer.

According to a preferred embodiment of the present invention, the latches will capture the value at their inputs on the rising edge of the component signal of the differential clock as shown. However, as discussed previously, the latches could be configured to capture the value at their inputs upon the occurrence of different events of the differential clock, such as falling edges, after the clock has stabilized for a period of time, and so forth. Note that the frequency of the differential clock should be fast enough so that it can accurately capture the value changes in the input signal, but slow enough so that it will permit changes to the value of the input signal to propagate through the inverter.

A period of time after the occurrence of the rising edge of the component signal of the differential clock, outputs of the latches change to match the change in input signal. The period of time may be equal to the propagation delay of the latches themselves and is displayed in FIG. 6 in highlight 632. Note that since both latches maybe triggered simultaneously and that the latch designs may be identical, the latch outputs change at approximately the same time.

After the outputs of the latches change, a period of time elapses that may be approximately equal to the propagation delay through a CML buffer (such as the CML buffer 530 (FIG. 5)) and the outputs of the CML buffer changes (displayed in curves 625 and 630). The propagation delay of the CML buffer is highlighted as highlight 634. Note that since the inputs to the CML buffer occur at approximately the same time, the outputs of the CML buffer may also occur at approximately the same time. Also note that the outputs of the CML buffer, with the exception of very small periods of time that occur during signal transitions, may not have the same signal values.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
   a first clocked latch having an input coupled to an input signal, the first clocked latch to capture a value at its input when triggered by a first clock signal;
   an inverter having an input coupled to an input signal, the inverter to invert the input signal;
   a second clocked latch having an input coupled to an output of the inverter, the second clocked latch go capture a value at its input when triggered by a second clock signal; and
   a differential mode circuit having a first input directly connected to an output of the first clocked latch and a second input directly connected to an output of the second clocked latch, the differential mode circuit containing circuitry to convert signals at its inputs into a differential mode signal;
   wherein the first and second clocked latches share a common design, and each clocked latch comprising:
   a first clocked inverting buffer having ma input directly connected to a latch input, the first clocked inverting buffer to invert a signal at its input when clocked by a first clock signal;
   an inverting buffer having an input directly connected to an output of the first clocked inverting buffer, the inverting buffer to invert a signal at its input; and
   a second clocked inverting buffer having an input directly connected to an output of the inverting buffer and an output directly connected to the input of the inverting buffer and also directly connected to the output of the first clocked inverting buffer, the second clocked inverting buffer to invert a signal at its input when clocked by a second clock signal, wherein the output of the clocked latch consists of a node that is directly connected to the output of the first clocked inverting buffer, the input of the inverting buffer and the output of the second clocked inverting buffer.

2. The circuit of claim 1, wherein the first and second clocked inverting buffers are clocked by differential mode clock signals.

3. The circuit of claim 2, wherein the first and second clocked inverting buffers are clocked by the same differential mode clock signal.

4. The circuit of claim 2, wherein a differential mode clock is made up of two component signals, and wherein the first clocked inverting buffer is coupled to the two component signals in a reversed polarity with respect to the second clocked inverting buffer.

5. The circuit of claim 1, wherein the flint and second clocked latches are tri-state inverting buffers.

6. The circuit of claim 1, wherein the first and second clock signals are the same.

7. The circuit of claim 6, wherein the clock signals are generated by a differential mode clock.

8. The circuit of claim 6, wherein the first and second clocked latches are triggered by state transitions in the clock signal.

9. The circuit of claim 6, wherein the clock signal has a frequency that is greater than a rate of change of the input signs.

10. The circuit of claim 9, wherein the clock signal has a period that is greater than a propagation delay through the inverter.

11. The circuit of claim 1, wherein the differential mode circuit comprises:

a first and a second resistor, each resistor having a first terminal coupled to a voltage supply; and a first and a second transistor, the first transistor having a first terminal coupled to a second terminal of the first resistor, the second transistor having a first terminal coupled to a second terminal of the second resistor, and the two transistors having second terminals coupled together.

12. The circuit of claim 11, wherein the first transistor having a third terminal coupled to the output of the first clocked latch and the second transistor having a third terminal coupled to the output of the second clocked latch.

13. The circuit of claim 11, wherein the differential made circuit further comprises a reference current source coupled to the second terminals of the first and second transistors.

14. The circuit of claim 13, wherein the reference current source comprises:

a third transistor having a first terminal coupled to the second terminal of the first and second transistors and a third terminal coupled to a reference voltage level; and an fourth transistor having a first terminal coupled to a second terminal of the third transistor and a third terminal coupled to the reference voltage level.

15. The circuit of claim 14, wherein the transistors are N-channel MOSFETs (metal oxide semiconductor field-effect transistors).

16. The circuit of claim 14, wherein the first, second, and third transistors have low threshold voltages relative to the fourth transistor.

17. The circuit of claim 14, wherein the transistor's first terminal is a drain terminal, wherein the transistor's second terminal is a source terminal, and wherein the transistor's third terminal is a gate terminal.

* * * * *

UNITED STATES PATENT AND TRADEMARK OFFICE
CERTIFICATE OF CORRECTION

PATENT NO.   : 6,853,229 B2
DATED        : February 9, 2005
INVENTOR(S)  : Viehmann et al.

It is certified that error appears in the above-identified patent and that said Letters Patent is hereby corrected as shown below:

Column 8,
Line 45, "go" should read -- to --;
Line 56, "ma" should read -- an --;

Column 9,
Line 19, "flint" should read -- first --;
Line 30, "signs" should read -- signal --; and Column 10,
Line 13, "made" should read -- mode --.

Signed and Sealed this

Thirty-first Day of May, 2005

JON W. DUDAS
*Director of the United States Patent and Trademark Office*